(12) United States Patent
He

(10) Patent No.: US 11,489,310 B2
(45) Date of Patent: Nov. 1, 2022

(54) OPTICAL POWER MONITORING USING DUAL MODULATION

(71) Applicant: Finisar Corporation, Sunnyvale, CA (US)

(72) Inventor: Hongdang He, Shanghai (CN)

(73) Assignee: II-VI DELAWARE, INC., Wilmington, DE (US)

( * ) Notice: Subject to any disclaimer, the term of this patent is extended or adjusted under 35 U.S.C. 154(b) by 447 days.

(21) Appl. No.: 15/947,630

(22) Filed: Apr. 6, 2018

(65) Prior Publication Data

US 2018/0294614 A1  Oct. 11, 2018

Related U.S. Application Data

(60) Provisional application No. 62/483,071, filed on Apr. 7, 2017.

(51) Int. Cl.

| | |
|---|---|
| *H01S 3/00* | (2006.01) |
| *G01R 21/06* | (2006.01) |
| *H01L 27/146* | (2006.01) |
| *G01R 29/08* | (2006.01) |
| *H04B 10/564* | (2013.01) |
| *H01S 5/0683* | (2006.01) |
| *G01R 31/26* | (2020.01) |
| *H01S 5/40* | (2006.01) |
| *H04B 10/40* | (2013.01) |

(52) U.S. Cl.
CPC ............ *H01S 3/0014* (2013.01); *G01R 21/06* (2013.01); *G01R 29/0885* (2013.01); *G01R 31/2635* (2013.01); *H01L 27/14643* (2013.01); *H01S 5/06832* (2013.01); *H04B 10/564* (2013.01); *H01S 5/4025* (2013.01); *H04B 10/40* (2013.01)

(58) Field of Classification Search
CPC ... H01S 3/0014; H01S 5/06832; G01R 21/06; G01R 29/0885; G01R 31/2635; H01L 27/14643; H04B 10/564
USPC ......................................................... 250/206
See application file for complete search history.

(56) References Cited

U.S. PATENT DOCUMENTS

| | | | | |
|---|---|---|---|---|
| 4,472,807 A | * | 9/1984 | Chubb ................... | H01S 5/042 327/109 |
| 5,296,695 A | * | 3/1994 | Bardos ............... | G06K 15/1214 250/205 |
| 5,426,452 A | * | 6/1995 | Davis .................. | H01S 5/06213 347/247 |

(Continued)

*Primary Examiner* — Thanh Luu
(74) *Attorney, Agent, or Firm* — Blank Rome LLP

(57) ABSTRACT

A system and method for measuring optical power is described. The optical system and method may include a module configured to generate a secondly modulated signal based on secondly modulating a firstly modulated signal with an amplitude modulated signal. The firstly modulated signal may include data that is modulated for transmission by a laser diode array. The firstly modulated signal may then be secondly modulated using amplitude modulation techniques. The system may further include a photodiode configured to generate a photodiode current based on optically sensing a laser diode array. The laser diode array outputs an optical output power based on being driven by the secondly modulated signal. The system may yet further include a controller configured to calculate the optical output power from the photodiode current based on the amplitude modulated signal.

19 Claims, 8 Drawing Sheets

(56) References Cited

U.S. PATENT DOCUMENTS

| | | | | |
|---|---|---|---|---|
| 5,608,747 A | * | 3/1997 | Baek | H04N 1/40031 |
| | | | | 358/523 |
| 7,630,631 B2 | * | 12/2009 | Aronson | H04B 10/40 |
| | | | | 398/185 |
| 2003/0002119 A1 | * | 1/2003 | Aretz | H04B 10/564 |
| | | | | 398/183 |
| 2009/0067455 A1 | * | 3/2009 | Murison | H01S 3/06758 |
| | | | | 372/20 |
| 2013/0302031 A1 | * | 11/2013 | Tanimura | H04B 10/07 |
| | | | | 398/38 |

* cited by examiner

OPTICAL POWER MONITORING USING DUAL MODULATION

CROSS-REFERENCE TO RELATED APPLICATION

This patent application claims priority to U.S. Provisional Patent Application Ser. No. 62/483,071, filed Apr. 7, 2017, which is incorporated herein by reference.

FIELD

Some embodiments described herein generally relate to optical power monitoring techniques for optical transmitters.

BACKGROUND

Unless otherwise indicated herein, the materials described herein are not prior art to the claims in the present application and are not admitted to be prior art by inclusion in this section.

High-bandwidth communication systems may be configured as optical networks that use optical transceivers. An optical transceiver may utilized a laser array (e.g., a vertical cavity surface emitter laser (VCSEL) array for transmission and a photodiode (PD) array for reception. Optical transmitters require constant or near constant monitoring of power levels for system diagnostics or other evaluation.

Laser transmitters, including VCSELs, may be susceptible to lifecycle degradation and temperature-dependent operation resulting in undesired variations in optical transmit power levels. Accordingly, reliable and accurate monitoring of optical power levels is necessary for maintaining reliable transmissions.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to techniques for optical power measurement in an optical transmission system.

In an example embodiment, an optical system includes a module configured to generate a secondly modulated signal based on secondly modulating a firstly modulated signal with an amplitude modulated signal. The firstly modulated signal may include data that is modulated for transmission by a laser diode array. The firstly modulated signal may then be secondly modulated using amplitude modulation techniques. The system may further include a photodiode or photodiode array configured to generate a photodiode current based on optically sensing a laser diode array. The laser diode array outputs an optical output power based on being driven by the secondly modulated signal. The system may yet further include a controller configured to calculate the optical output power from the photodiode current based on the secondly amplitude modulated signal.

In another example embodiment, a method includes generating a secondly modulated signal based on secondly modulating a firstly modulated signal with an amplitude modulated signal. The firstly modulated signal may include data that is modulated for transmission by a laser diode array. The method may further include generating a photodiode current based on optically sensing a laser diode array outputting an optical output power based on being driven by the secondly modulated signal. The method may yet further include calculating the optical output power from the photodiode current based on the amplitude modulated signal.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Embodiments described herein generally relate to power monitoring techniques for optical transmitters in an optical transmission system.

Some embodiments described herein may allow for improved calculation of optical power levels with improved resolution. For example, systems and methods described herein allow for measurement of specific threshold currents so that dark currents associated with photodiodes may be reduced or eliminated. Further, crosstalk at the photodetector (PD) from other laser diodes in an array may be identified and accounted for.

An example embodiment may include an optical system includes a module configured to amplitude modulate a firstly modulated signal into a secondly modulated signal. The firstly modulated signal may include data that is modulated for transmission by a laser diode array. The firstly modulated signal may then be secondly modulated using amplitude modulation techniques. The system may further include a photodiode or photodiode array configured to generate a photodiode currents based on optically sensing a laser diode array. The laser diode array outputs an optical output power based on being driven by the secondly modulated signal. The system may yet further include a controller configured to calculate the optical output power from the photodiode current based on the amplitude modulated signal.

In one example of a laser diode (LD) array, one LD may correspond to one monitoring photodetector (MPD) for higher power monitoring accuracy. Crosstalk between the different laser diodes (LDs) may be reduced by utilizing the secondly modulated signal by to identify and calculate the crosstalk. In another example, one monitoring photodetector (MPD) may be used to monitor multiple laser diodes (LDs) in an array using time division multiplexing to identify and calculate the crosstalk.

Another example embodiment may include a method for amplitude modulating a firstly modulated signal into a secondly modulated signal. The firstly modulated signal may include data that is modulated for transmission by a laser diode array. The method may further include generating a photodiode current based on optically sensing a laser diode array outputting an optical output power based on being driven by the secondly modulated signal. The method may yet further include calculating the optical output power from the photodiode current based on the amplitude modulated signal.

Optical transceivers often use power monitoring systems to compensate for power level fluctuations. A power monitoring system may include one or more photodiodes that measure light intensity from the output of a portion of the VCSEL's modulated output light beam. One or more photodiodes may be formed as part of a power control loop and may provide, for example, a digital readout that generates intensity data and provides control to a VCSEL or other laser diode drive circuit.

Figure 1:
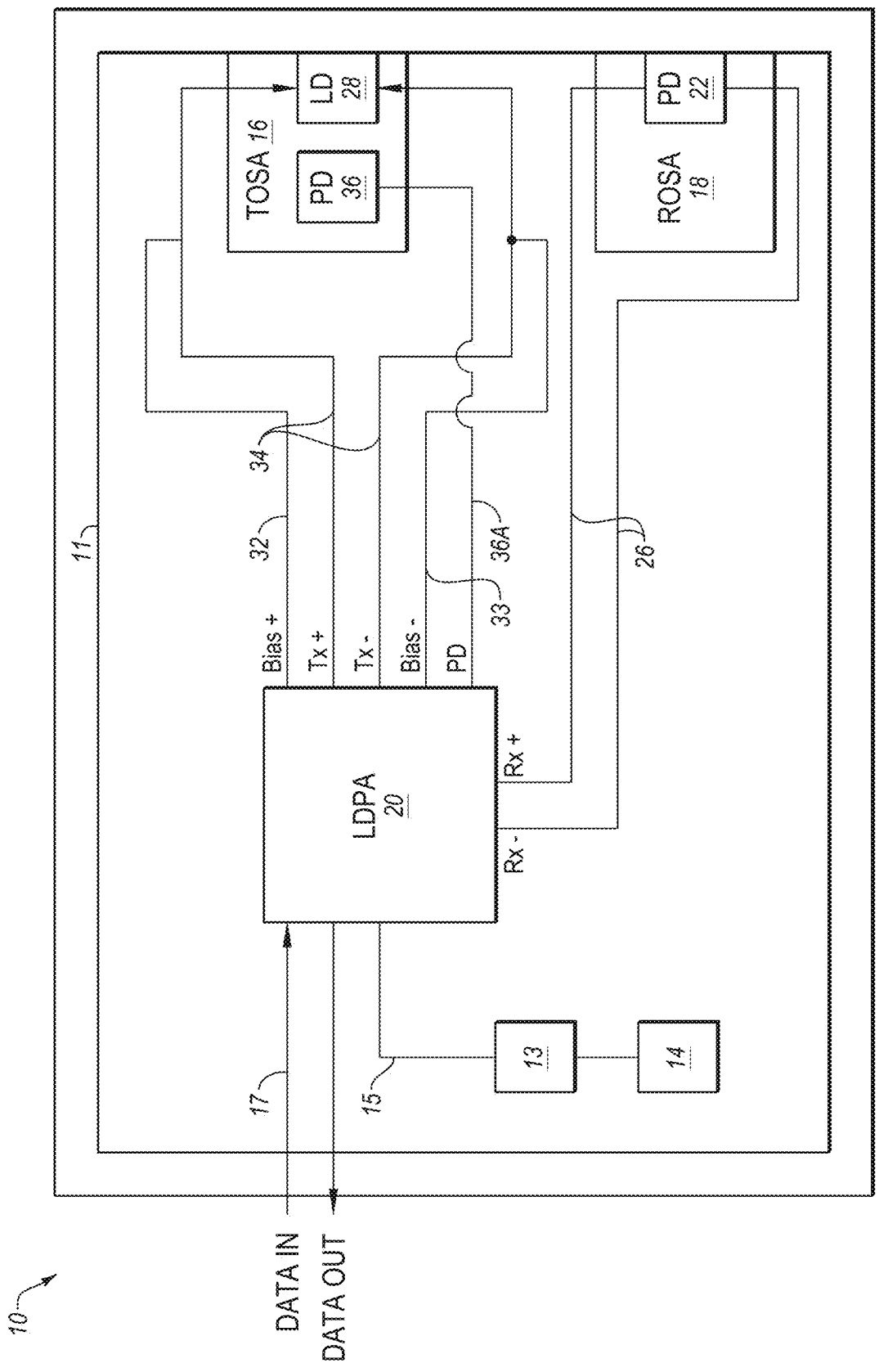
FIG. 1 illustrates various details of an optical transceiver module.

FIG. 1 illustrates various details of an optical transceiver module ("transceiver"), generally designated at 10, according to one embodiment. The transceiver 10 is configured for use in transmitting and receiving optical signals in connection with an external host (not shown) that is operatively connected in one embodiment to a communications network (also not shown). As depicted, the transceiver 10 shown in FIG. 1 contains various components positioned on or in relation to a printed circuit board ("PCB") 11 for enabling the transceiver to communicatively interface with the host. A controller 13 including control code and data is included for providing control signals and timing for the various modules with transceiver 10. Persistent memory 14 is included on the PCB 11 to store pertinent data, such as identification and initial settings information for the transceiver 10.

The transceiver 10 further includes a transmitter optical subassembly ("TOSA") 16 and receiver optical subassembly ("ROSA") 18 that collectively enable transmission and reception by the transceiver of data-containing optical signals via optical fibers (not shown) that connect with the TOSA and ROSA. As such, the PCB 11 facilitates electrical communication between each of the TOSA 16, TOSA 18 and the host.

During operation, the transceiver 10 may receive a data-carrying electrical signal from the host, which may be any computing system capable of communicating with the transceiver 10, for transmission as a data-carrying optical signal on to an optical fiber (not shown). This electrical data signal that is supplied to the transceiver 10 is carried via a pair of differential transmit signal lines 34. Each signal line of the differential signal line pair carries one of two streams of differential electrical data that differ from each other only in signal polarity. As such, the lines are respectively indicated with "Tx" and a "+" or a "−" indicator, indicating the respective positive or negative polarity of each transmit line. The electrical differential data signal is provided to a light source, such as a laser diode array ("LD") 28 located in the TOSA 16, which converts the electrical signal into a data-carrying optical signal for emission on an optical fiber and transmission via an optical communications network, for instance. The laser diode array 28 may be a VCSEL, or other suitable light source. Accordingly, the TOSA 16 serves as an electro-optic transducer.

Two differential laser bias signal lines 32 and 33 are also included and associated with the differential transmit signal lines 34 to provide a bias current to the laser diode array 28 to enable its operation. These are identified by "Bias +" (line 32) and "Bias −" (line 33) to respectively indicate their polarity relationship to the transmit signal lines 34. Also, the TOSA 16 includes a photodetector ("PD") 36 that is used to monitor the power of the optical signal emitted by the laser diode array 28. A "PD" signal line 36A is operably connected with the PD 36.

In addition, the transceiver 10 is configured to receive a data-carrying optical signal from an optical fiber via the ROSA 18. The ROSA 18 acts as an opto-electric transducer by transforming the received optical signal, via a photodiode ("PD") 22 or other suitable device, into an electrical signal. The resulting electrical signal is carried via a pair of differential receive signal lines 26. As is the case with the differential transmit signal lines 34, each signal line of the differential receive signal lines 26 carries one of two streams of differential electrical data that differ from each other only in signal polarity. As such, the lines are respectively denoted with an "Rx" and a "+" or a "−" designation, indicating the respective positive or negative polarity of each line.

Electronic componentry is included on the PCB 11 of the transceiver 10 to assist in data signal transmission and reception. In the illustrated embodiment, a post amplifier for conditioning the electrical signal received from the photodiode 22 is consolidated with a laser driver for driving the laser diode array 28 to form a laser driver/post amplifier ("LDPA") 20.

Figure 2:
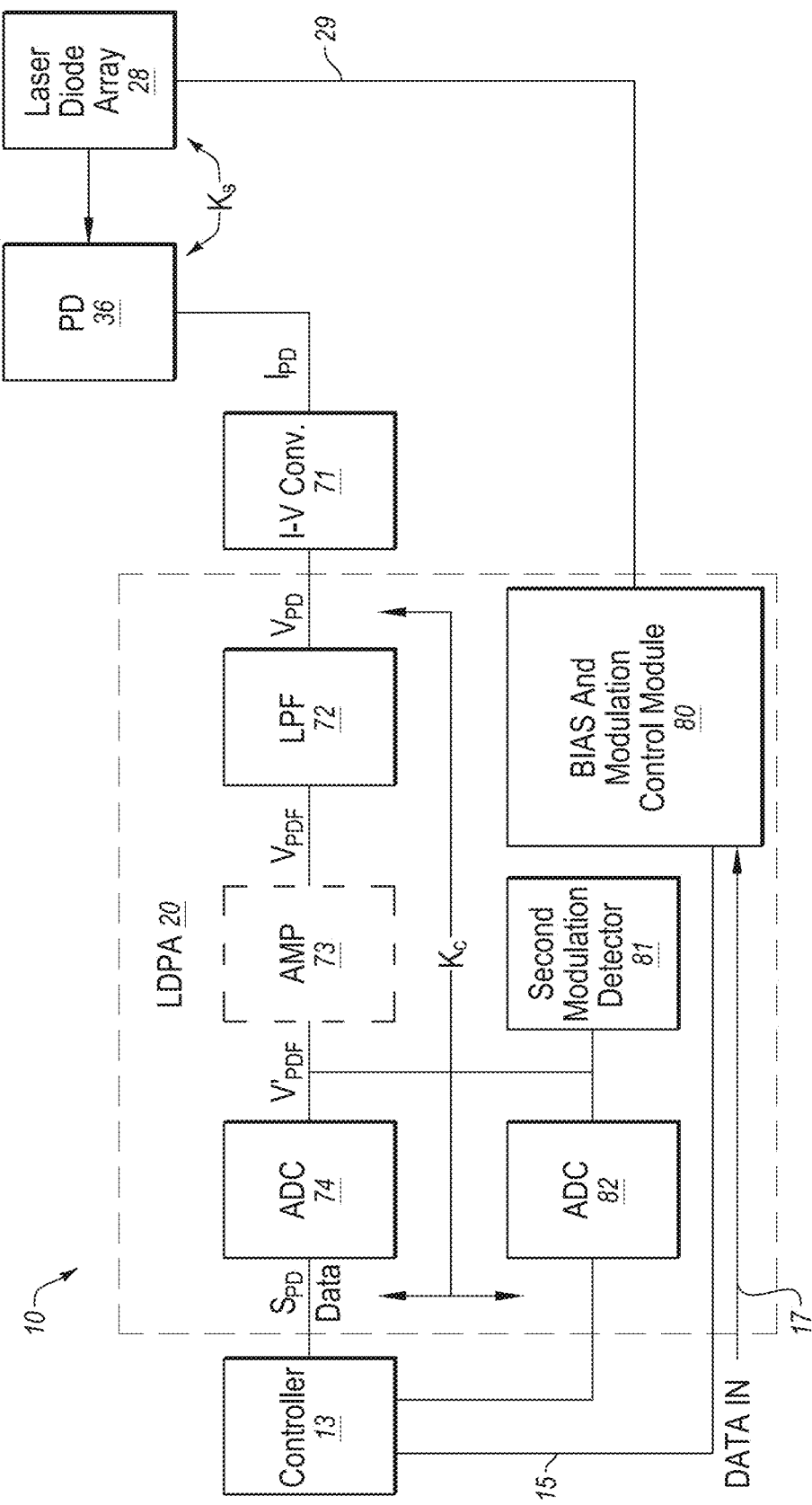
FIG. 2 is a block diagram illustrating an optical power monitoring portion of a transceiver.

FIG. 2 is a block diagram illustrating an optical power monitoring portion of a transceiver, in accordance with an embodiment. The transceiver 10 includes LDPA 20 for measuring the optical power of the laser diode array 28. The laser diode array 28 generates and output optical signal with a portion of the optical output signal being directed to the PD 36. The PD 36 monitors the transmitted optical signal and generates a current signal $I_{PD}$. The PD 36 couples to a current-to-voltage (I-V) converter 71 and receives the input current signal $I_{PD}$ and generates a voltage $V_{PD}$. The I-V converter 71 couples to a low pass filter (LPF) 72 and filters the voltage $V_{PD}$ into a filtered voltage $V_{PDF}$. The filtered voltage $V_{PDF}$ may alternatively be amplified by an amplifier 73 into an amplified filtered voltage $V'_{PDF}$. The filtered voltage $V_{PDF}$ may then be sampled (digitized) into a sampled PD signal $S_{PD}$ (Data) by an analog-to-digital converter (ADC) 74.

The transceiver 10 further includes the controller 13 coupled to the ADC 74.

The LDPA 20 further includes a bias and modulation control module 80 coupled to the laser diode array 28 and controlled by control signal from the controller 13. The LDPA 20 further includes a second modulation detector 81 configured to provide the $\Delta_P$ for a specific laser diode. An ADC 82 provides a numeric representation of the $\Delta_P$.

In operation, a sampling ratio $K_S$ is defined between the incident light from laser diode array 28 that is received by PD 36 and the transmitted light from laser diode array 28. A converting coefficient $K_C$ is defined between power at the PD 36 and the sampled PD signal $S_{PD}$ (Data) at the ADC 74. Accordingly, Data=$K_C K_S$ P where P is the total power at the laser diode array 28. Also, Data=$K_C I_{PD}$.

Figure 3:
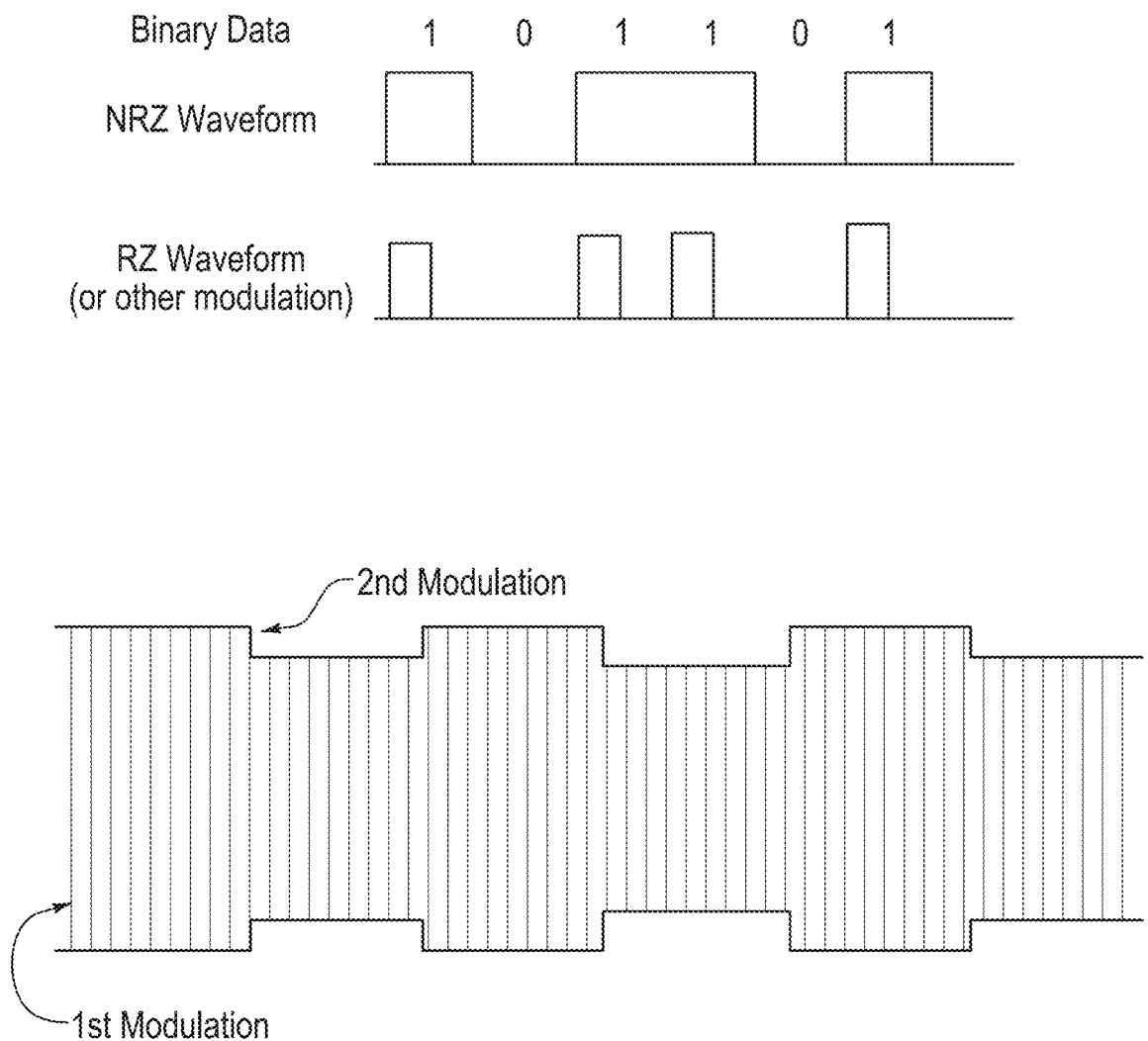
FIG. 3 illustrates a dual modulation in the optical output signal.

FIG. 3 illustrates a dual modulation in the optical output signal, in accordance with an embodiment. The serial input data DATA IN of FIG. 2 may be modulated in one of various known modulation techniques, illustrated as a first modulation. Generally, the first modulation process modulates serial binary data into an optical signal for transmission, for example, on an optical fiber. The serial binary data may be return-to-zero (RZ) or non-return-to-zero (NRZ) binary data. Further, the first modulation is not limited to RZ and NRZ techniques.

A second modulation is applied to the first modulated signal. The second modulation may be amplitude modulation (AM) and may be small in amplitude so as to not affect the ability to transmit and receive the modulated binary data. Further, the second modulation may be low frequency and out-of-band of the first modulation.

Figure 4:
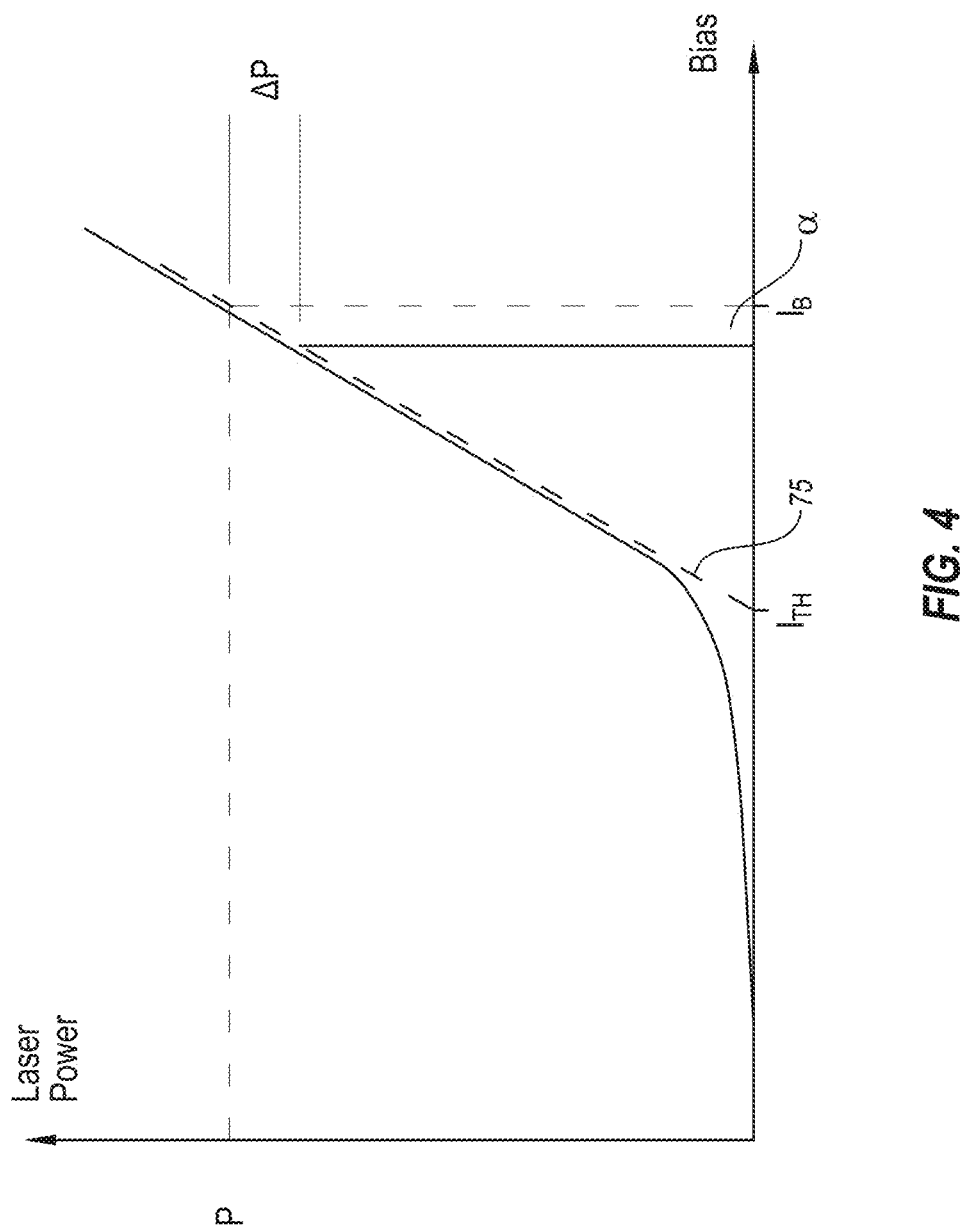
FIG. 4 is a plot of optical output power as a function of bias current.

FIG. 4 is a plot of optical output power as a function of bias current. In an optical communication system, the optical output power of a laser, such as laser diode array 28, has a specific correlation with the bias current to the laser. Typically, the correlation is approximately linear in the operational region of the laser as noted by the line 75. A threshold current $I_{TH}$ is denoted as an input current to the laser where no output power is generated. Further, a bias current $I_B$ is illustrated as a typical operating bias current for operation of the laser. Accordingly, an effective bias current $I_{BE}$ may be defined where $I_{BE}=I_B-I_{TH}$.

The plot of FIG. 4 also illustrates a bias deviation $\alpha$, where the output power changes by $\Delta P$. Therefore, the optical power P of the laser, may be written as $$P = K_{SE} I_{BE} = \frac{\Delta P}{\alpha} I_{BE} \text{ where } K_{SE} \text{ is the slope efficiency of the laser.} \quad \text{(Eq. 1)}$$

As described above with reference to FIG. 2, the incident power from the laser diode array 28 to the PD 36 is defined by the coefficient $K_S$ where the ratio is $P_{PD}=K_S$ P. Further, after (i) the PD 36 converts the incident power to the photo current $I_{PD}$, (ii) the I-V converter 71 converts the current to a voltage, (iii) the LPF 72 smooths voltage $V_{PD}$ into $V_{PDF}$, (iv) the amplifier 73 optionally amplifies the signal to an amplified voltage $V'_{PDF}$, then the ADC 74 generates sample $S_{PD}$ (Data) which represents a deviation, based on $\alpha$, of the power.

Specifically, $$\text{Data}=K_C K_S \Delta_P \quad \text{(Eq. 2)}$$

wherein $K_C$ is the converting coefficient from PD to the laser as identified from (Data=$K_C P_{PD}$).

From Eq. 1 and Eq. 2:

$$P = \frac{\text{Data} I_{BE}}{K_C K_S \alpha} \quad \text{(Eq. 3)}$$

Further, if $\alpha$ is a small alternating deviation of the DC bias current, then at a reference temperature $T_0$:

$$P_0 = \frac{\text{Data}_0 I_{BE0}}{K_C K_S \alpha} = K \text{Data}_0 \quad \text{(Eq. 4)}$$

Then, for any other temperatures T:

$$P = \frac{\text{Data} I_{BE}}{K_C K_S \alpha} = \left(\frac{I_{BE}}{I_{BE0}}\right) K \text{Data} \quad \text{(Eq. 5)}$$

Accordingly, Equations 2-5 correlate AC bias deviation with optical output power, wherein K is a summarized coefficient correlating Data at the ADC 74 with the optical output power at the laser diode array 28. Further, $I_{BE}$ and Data are respectively effective bias current and the ADC 74 output Data at any temperature.

Correlating the optical power with an AC amplitude provides the benefit of eliminating 'dark current' in the PD 36. This occurs since the optical power is represented as an AC amplitude, therefor the dark current can be eliminated using conventional signal processing.

Figure 5:
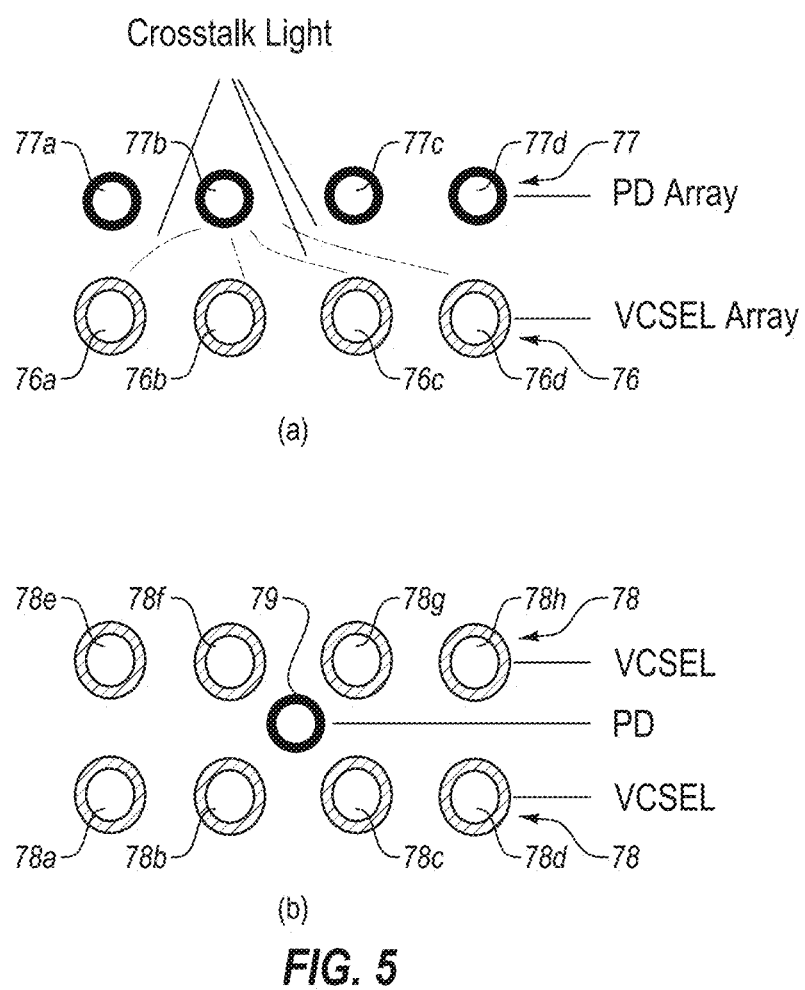
FIG. 5 illustrates differently configured arrays of laser diode arrays.

FIG. 5 illustrates differently configured arrays of laser diode arrays, in accordance with an embodiment. The array in FIG. 5(a) illustrates a first array of laser diodes (e.g., VCSELs) 76. FIG. 5(a) further illustrates a PD array 77 of a respective plurality of PDs. When the laser diodes 76a-76d are active, they each generate light which may be desirable or undesirable for different ones of the PDs 77a-77d. For example, light generated by laser diode 76b is intended for detection by respective PD 76b. However, light generated by laser diodes 76a, 76c, and 76d create undesirable crosstalk light or interference when receive by PD 77b. The crosstalk may need to be identified and accounted for in readings (measurements) at the respective PD 77a-77d. Due to AC optical power monitoring, crosstalk influence cannot be avoided, however, using different time slots, laser diodes (LDs) may be secondly modulated allowing a photo diode (PD), such as PD 77b, to identify and calculate out crosstalk and dark current from adjacent laser diodes, such as from laser diodes 76a-76d.

Another array in FIG. 5(b) illustrates a first array of laser diodes (e.g., VCSELs) 78. FIG. 5(b) further illustrates a PD 79. When the laser diodes 78a-78h are active, they each generate light which may be received by PD 79. Light generated by ones of laser diodes 78a-78h that are not being read (measured) generate interference that need to be accounted. In the various embodiments of FIG. 5, to identify and account for the crosstalk, the second modulation as discussed above is individually applied to each laser diode 78a-78h so that neighboring VCSEL contributions of the DC optical power can be eliminated. The second modulation is applied in a time division manner to laser diodes 78a-78h, and the power may be measured by PD 79. The optical power may them be correlated with the AC amplitude to eliminate crosstalk and dark current. Further, gain may be adjusted, such as by amplifier 73 in FIG. 2, when there is a large sampled PD signal $S_{PD}$ (Data) difference.

By eliminating dark current in the PDs and eliminating (identifying) crosstalk from neighboring laser diodes, the optical power more accurately and precisely be determined. Further, the embodiment of FIG. 5(*b*) requires fewer PDs and therefore reduces required area and improves reliability. Yet further, due to AC power monitoring, crosstalk at a PD can be beneficially used to monitor the power of neighboring laser diodes. Also, the PD or PDs may be located at a further distance from the laser diodes, and a PD may even be mounted on a laser driver integrated circuit with a defocus lens.

A further embodiment may include removal of a reflecting plate to simplify an optical design. One type of fiber optical system consists of a laser, a reflecting plate, a PD, and a lens. The fiber reflecting plate transfers partial light to the PD for monitoring of optical output power. In one embodiment, since the optical power is represented as an amplitude modulated (AM) AC signal which is readily detectable, the reflecting plate may be removed or forgone and replaced with diffusion reflection for monitoring the optical power. The diffusion reflection may be tapped from the lens or from the end of the optical fiber.

Figure 6A:
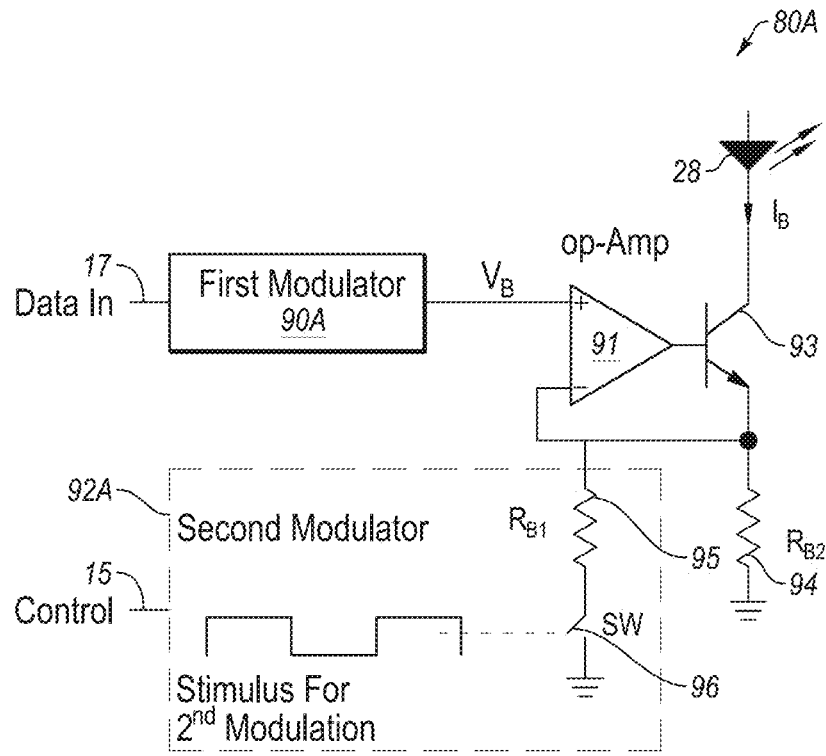
FIGS. 6A-6C illustrates block diagrams of the bias and modulation control.
Figure 6B:
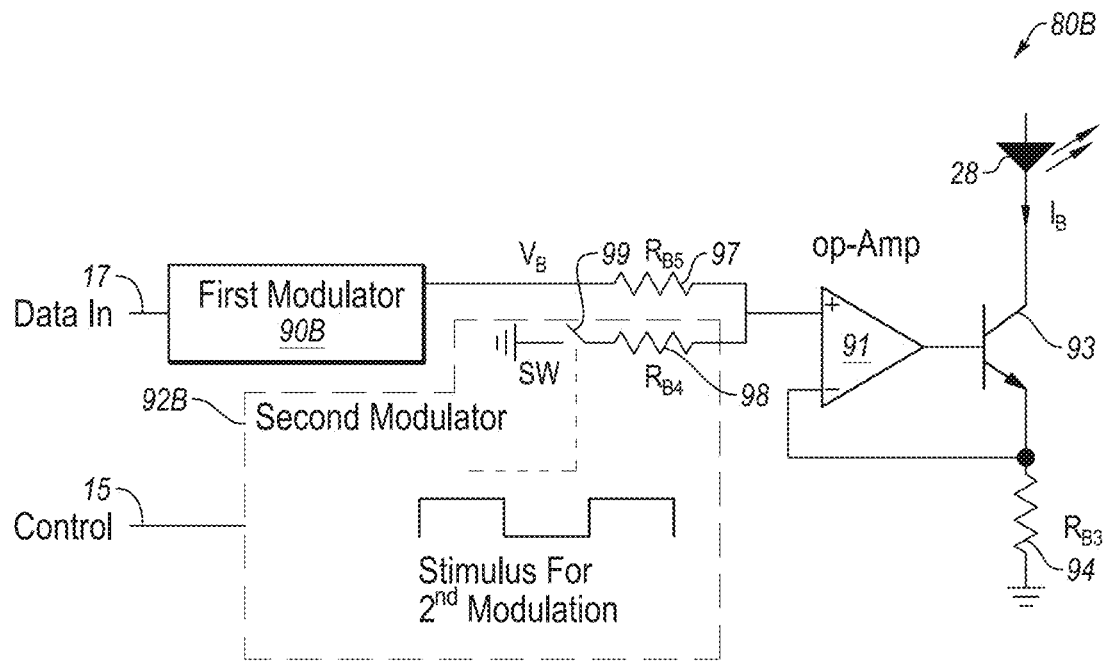
Figure 6C:
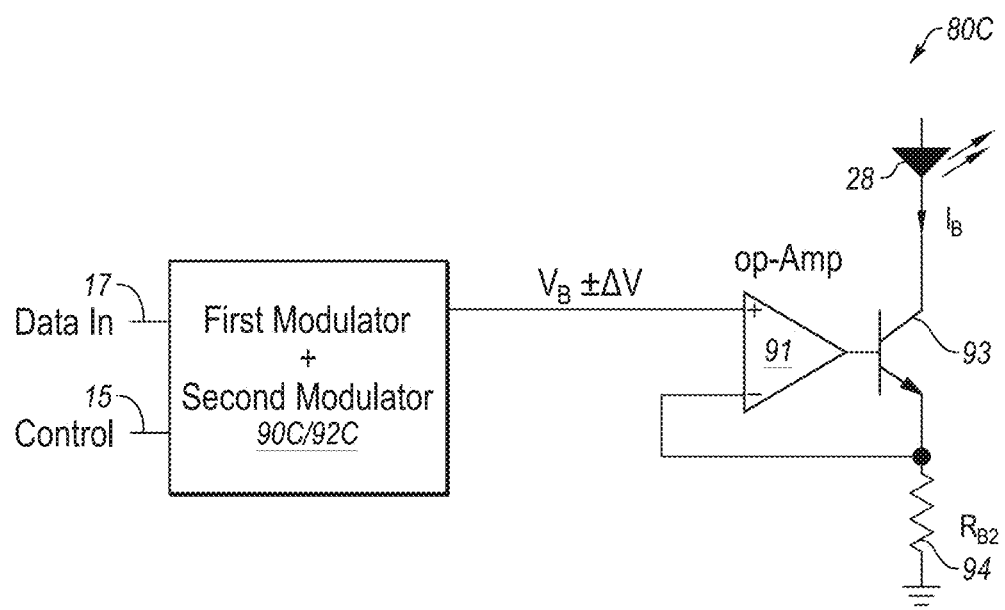

FIGS. 6A-6C illustrates block diagrams of the bias and modulation control, in accordance with various embodiments. While FIGS. 6A-6C illustrate discrete embodiments, combinations of the disclosed embodiments is also contemplated. Generally, the various embodiments disclose combining a second modulation with a first modulation.

In FIG. 6A, a bias and modulation control module 80A couples to a unity gain configured amplifier 91 which controls a driver amplifier 93. Driver amplifier may be further coupled to a bias resistor 94 and to the laser diode array 28. The bias and modulation control module 80A may include a first modulator 90A configured to provide the first modulation of the DATA IN signal and generate a first modulated signal to one input of the unity gain configured amplifier 91. The bias and modulation control module 80A may further include a second modulator 92A to provide a second modulation based on the control signal 15. The second modulator 92A further including a switch 96 controlled by the control signal 15 and configured to alternatingly change the bias on the feedback of the unity gain configured amplifier 91 by alternatingly switching in a further bias resistor 95. Generally, the resistor 95 is much greater than (>>) the resistor 94, therefore, the bias current $I_B$ alternates between $$\frac{V_B}{R_{B2}} \text{ and } \frac{V_B}{R_{B2}}\left(1 + \frac{R_{B2}}{R_{B1}}\right).$$

In FIG. 6B, a bias and modulation control module 80B couples to a unity gain configured amplifier 91 which controls a driver amplifier 93. Driver amplifier may be further coupled to a bias resistor 94 and to the laser diode array 28. The bias and modulation control module 80B may include a first modulator 90B configured to provide the first modulation of the DATA IN signal and generate a first modulated signal to one input of the unity gain configured amplifier 91. The bias and modulation control module 80B may further include a second modulator 92B configured to provide a second modulation based on the control signal 15. The second modulator 92B further including a switch 99 controlled by the control signal 15 and configured to alternatingly change the bias on the input to the unity gain configured amplifier 91 by alternatingly switching in a further bias resistor 98. Generally, the resistor 98 is much greater than (>>) the resistor 97, therefore, the bias current $I_B$ alternates between $$\frac{V_B}{R_{B3}} \text{ and } \frac{V_B}{R_{B3}}\left(1 - \frac{R_{B5}}{R_{B4}}\right).$$

In FIG. 6C, a bias and modulation control module 80C couples to a unity gain configured amplifier 91 which controls a driver amplifier 93. Driver amplifier may be further coupled to a bias resistor 94 and to the laser diode array 28. The bias and modulation control module 80B may include a combined modulator of a first modulator 90C and a second modulator 92C together configured to provide the first and second modulation of the DATA IN signal and generate a first and second modulated signal to one input of the unity gain configured amplifier 91. The combined modulator 90C/92C generating an output signal that includes both the first and second modulation of the DATA IN signal. Further, the combined modulator 90C/92C may be configured as digital-to-analog converter.

Figure 7:
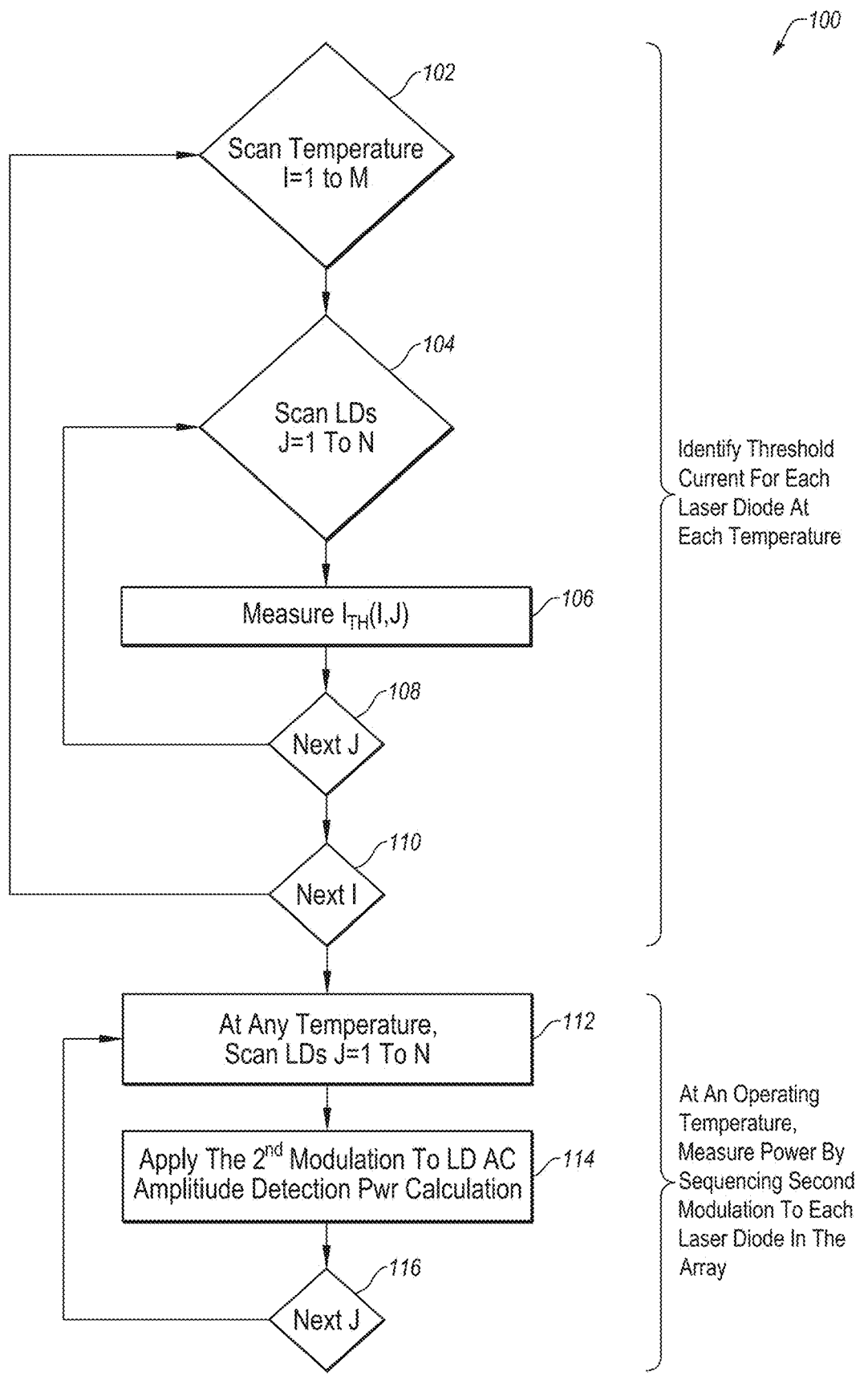
FIG. 7 is a flowchart of a process for identifying threshold currents for laser diodes and secondly modulating, detecting and calculating optical power in an array of laser diodes.

FIG. 7 is a flowchart of a process for identifying threshold currents for laser diodes and secondly modulating, detecting and calculating optical power in an array of laser diodes, according to the various embodiments. A process 100 may be configured to accommodate a single PD, a quantity N of laser diodes, over a range of M temperatures. In process 100, blocks 102-110 determine the threshold current $I_{TH}$ for each laser diode at each temperature. This threshold current $I_{TH}$ is then available for calculating the optical output power. In process 100, blocks 112-116 measure the power at the current specific operating temperature for the laser diode array by individually applying the second modulation to each of the laser diodes in the array.

In process 100, a block 102 selects an initial scan temperature I for the loop and then compares each I for completing all of the M iterations. A block 104 sets an initial laser diode for measuring and then compares each J for completing all of the N iterations. At a block 106, a threshold current $I_{TH}$ for the specific temperature I and the laser diode J is measured. At a block 108, the index of the laser diode in the array is incremented. At a block 110, the index of the temperature is incremented.

In process 100, a block 112 identifies a current operating temperature and sets an initial laser diode for measuring and then compares each J for completing all of the N iterations of the sequence of laser diodes in the array. At a block 114, the second modulation is provided to one of the laser diodes in the array. The second modulation is detected and the power is calculated for that specific laser array. At a block 116, the process sequences to the next laser diode in the array.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A device, comprising:
    a module configured to amplitude modulate a firstly modulated signal into a secondly modulated signal;
    a photodiode configured to generate a photodiode current based on optically sensing a laser diode array outputting an optical output power based on being driven by the secondly modulated signal; and
    a controller configured to:
        apply the secondly modulated signal based on time division to individually drive a plurality of laser diodes of the laser diode array;
        calculate the optical output power from the photodiode current; and
        identify and account for, in the calculation of the optical output power, optical crosstalk from adjacent ones of the laser diodes in the laser diode array based on the time division used to apply the secondly modulated signal to individually drive the laser diodes.

2. The device of claim 1, wherein the module includes:
    a first modulator configured to firstly modulate a data input signal into the firstly modulated signal;
    a second modulator configured to secondly modulate the firstly modulated signal into the secondly modulated signal; and
    a unity gain amplifier driven by at least the firstly modulated signal.

3. The device of claim 2, wherein the second modulator secondly modulates a feedback path of the unity gain amplifier.

4. The device of claim 2, wherein the second modulator secondly modulates the firstly modulated signal at an input of the unity gain amplifier.

5. The device of claim 2, wherein the secondly modulated signal is generated from a digital-to-analog (DAC) converter.

6. The device of claim 1, wherein each of the plurality of laser diodes is individually secondly modulated by a modulator.

7. The device of claim 1, wherein to calculate the optical output power and identify and account for the optical crosstalk, the controller is further configured to measure power from each of the plurality of laser diodes as individually secondly modulated.

8. The device of claim 1, wherein the controller is further configured to measure a threshold current for each of the plurality of laser diodes of the laser diode array.

9. The device of claim 8, wherein the controller is further configured to measure the threshold current of each of the plurality of laser diodes over a plurality of temperatures.

10. A method, comprising:
    amplitude modulating a firstly modulated signal into a secondly modulated signal;
    applying the secondly modulated signal based on time division to individually drive a plurality of laser diodes of the laser diode array;
    generating a photodiode current based on optically sensing the laser diode array outputting an optical output power based on being driven by the secondly modulated signal; and
    calculating the optical output power from the photodiode current; and
    identifying and accounting for, in the calculation of the optical output power, optical crosstalk from adjacent ones of the laser diodes in the laser diode array based on the time division used to apply the secondly modulated signal to individually drive the laser diodes.

11. The method of claim 10, wherein the generating a secondly modulated signal includes:
    firstly modulating a data input signal into the firstly modulated signal;
    secondly modulating the firstly modulated signal into the secondly modulated signal; and
    driving a unity gain amplifier by at least the firstly modulated signal.

12. The method of claim 11, wherein the secondly modulating includes modulating a feedback path of the unity gain amplifier.

13. The method of claim 11, wherein the secondly modulating includes modulating the firstly modulated signal at an input of the unity gain amplifier.

14. The method of claim 11, wherein the secondly modulated signal is generated from a digital-to-analog (DAC) converter.

15. The method of claim 10, wherein the applying the secondly modulated signal includes individually secondly modulating each of the plurality of laser diodes of the laser diode array.

16. The method of claim 10, further wherein the calculating the optical output power and identifying and accounting for the optical crosstalk includes individually measuring power from each of the plurality of laser diodes.

17. The method of claim 10, further comprising measuring a threshold current for each of the plurality of laser diodes of the laser diode array.

18. The method of claim 17, further comprising measuring the threshold current of each of the plurality of laser diodes over a plurality of temperatures.

19. A device, comprising:
    a first modulator configured to firstly amplitude modulate a data input signal into a firstly modulated signal;
    a second modulator configured to secondly modulate the firstly modulated signal into the secondly modulated signal;
    a unity gain amplifier driven by at least the firstly modulated signal;
    a photodiode configured to generate a photodiode current based on optically sensing a laser diode array outputting an optical output power based on being driven by the secondly modulated signal; and a controller configured to:
   apply the secondly modulated signal based on time division to individually drive a plurality of laser diodes of the laser diode array;
   calculate the optical output power from the photodiode current; and
   identify and account for, in the calculation of the optical output power, optical crosstalk from adjacent ones of the laser diodes in the laser diode array based on the time division used to apply the secondly modulated signal to individually drive the laser diodes.

* * * * *